United States Patent
Lee et al.

(10) Patent No.: US 7,855,421 B2
(45) Date of Patent: Dec. 21, 2010

(54) EMBEDDED PHASE-CHANGE MEMORY AND METHOD OF FABRICATING THE SAME

(75) Inventors: Seung-Yun Lee, Daejeon (KR); Sangouk Ryu, Daejeon (KR); Sung Min Yoon, Daejeon (KR); Young Sam Park, Daejeon (KR); Kyu-Jeong Choi, Daejeon (KR); Nam-Yeal Lee, Daejeon (KR); Byoung-Gon Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 195 days.

(21) Appl. No.: 11/633,216

(22) Filed: Dec. 4, 2006

(65) Prior Publication Data

US 2007/0173010 A1 Jul. 26, 2007

(30) Foreign Application Priority Data

Dec. 8, 2005 (KR) ................ 10-2005-0120101
Apr. 27, 2006 (KR) ................ 10-2006-0038331

(51) Int. Cl.
*H01L 29/66* (2006.01)

(52) U.S. Cl. ............. 257/378; 257/295; 257/298; 257/536; 257/499; 257/509; 257/525; 257/526; 257/539; 257/552; 257/558; 257/E27.004; 257/E27.015; 257/E21.422; 257/E21.683; 257/E21.696; 438/3; 438/666; 438/947

(58) Field of Classification Search ........... 257/2–5, 257/295–298, 529, 536, 537, E27.004, E31.029, 257/E45.002, 378, 499, 509, 525, 526, 539, 257/548, 552, 557, 558, 549, E27.015, E21.422, 257/E21.683, E21.696; 365/154; 438/3, 438/666, 947

See application file for complete search history.

(56) References Cited

U.S. PATENT DOCUMENTS

| 5,547,893 | A | 8/1996 | Sung |
| 5,933,365 | A | 8/1999 | Klersy et al. |
| 6,673,648 | B2 * | 1/2004 | Lowrey ............... 438/102 |
| 6,841,448 | B2 | 1/2005 | Gehring et al. |
| 6,949,764 | B2 * | 9/2005 | Ning ..................... 257/47 |

(Continued)

FOREIGN PATENT DOCUMENTS

| KR | 1020030015644 A | 2/2003 |
| KR | 1020040077302 A | 9/2004 |
| KR | 1020060061232 A | 6/2006 |

OTHER PUBLICATIONS

Hwang, Y.N., et al., "Phase-Change Chalcogenide Nonvolatile RAM Completely Based on CMOS Technology." 2003. *IEEE* 0-7803-7765-6/03, pp. 29-31.

(Continued)

*Primary Examiner*—Cuong Q Nguyen
*Assistant Examiner*—Meiya Li
(74) *Attorney, Agent, or Firm*—Ladas & Parry LLP

(57) ABSTRACT

An embedded memory required for a high performance, multifunction SOC, and a method of fabricating the same are provided. The memory includes a bipolar transistor, a phase-change memory device and a MOS transistor, adjacent and electrically connected, on a substrate. The bipolar transistor includes a base composed of SiGe disposed on a collector. The phase-change memory device has a phase-change material layer which is changed from an amorphous state to a crystalline state by a current, and a heating layer composed of SiGe that contacts the lower surface of the phase-change material layer.

7 Claims, 4 Drawing Sheets

U.S. PATENT DOCUMENTS

| | | | | |
|---|---|---|---|---|
| 7,053,431 B2* | 5/2006 | Ogiwara | ............ | 257/295 |
| 7,135,696 B2* | 11/2006 | Karpov et al. | ............ | 257/2 |
| 7,227,171 B2* | 6/2007 | Bez et al. | ............ | 257/3 |
| 2005/0054171 A1* | 3/2005 | Chu et al. | ............ | 438/312 |
| 2006/0055065 A1* | 3/2006 | Liu et al. | ............ | 257/903 |
| 2006/0148229 A1* | 7/2006 | Wang et al. | ............ | 438/593 |
| 2006/0186440 A1* | 8/2006 | Wang et al. | ............ | 257/246 |

OTHER PUBLICATIONS

Bedeschi, F., et al., "An 8Mb Demonstrator for High-Density 1.8V Phase-Change Memories." 2004. *IEEE 2004 Symposium on VLSI Circuits, Digest of Technical Papers*, pp. 442-445.

Lowrey, T.A., et al., "Characteristics of OUM Phase Change Materials and Devices for High Density Nonvolatile Commodity and Embedded Memory Applications." 2004. *2004 Materials Research Society Sumposium Proc.*, vol. 803, pp. HH2.1.1-12.

* cited by examiner

EMBEDDED PHASE-CHANGE MEMORY AND METHOD OF FABRICATING THE SAME

CROSS-REFERENCE TO RELATED PATENT APPLICATION

This application claims the benefit of Korean Patent Application No. 10-2005-0120101, filed on Dec. 8, 2005, and 10-2006-0038331, filed on Apr. 27, 2006 in the Korean Intellectual Property Office, the disclosure of which is incorporated herein in its entirety by reference.

BACKGROUND OF THE INVENTION

1. Field of the Invention

The present invention relates to an embedded phase-change memory and a method of fabricating the same, and more particularly, to an embedded phase-change memory that carries out a memory function within a System On Chip (SOC), and a method of fabricating the same.

2. Description of the Related Art

Phase-change memories are non-volatile memories which maintain stored information even without a power supply. The phase-change memory includes a phase-change material whose electrical resistance changes depending on its crystalline structure. The phase-change material generally consists of elements of Groups VIA through IVA on the periodic table. Because the crystalline structure and electrical resistance remain regardless of the supply of electrical power, this memory is non-volatile.

The phase change which results in a difference of electrical resistance is caused by an electric current. The resistance is high when the crystalline structure of the phase-change material is amorphous, and low when the structure is crystalline. The difference between the two states is at least 100-fold. The phase change from the amorphous state to the crystalline state is referred to as "Set," and the phase change from the crystalline state to the amorphous state is referred to as "Reset." The electrical input can both "Set" and "Reset," allowing the phase change material to be used in non-volatile memory.

$Ge_2Sb_2Te_5$(GST) is a common phase-change material. When a current pulse flows through GST under the amorphous state for a certain time period, the temperature of the GST is raised to over its crystallization temperature, thereby changing the state of the GST into the crystalline state ("Set"). By applying a current pulse to the GST under the crystalline state, the temperature of the GST is raised to over its melting point, so that the GST is in a liquid state. When the current is stopped, the amorphous crystalline structure of the liquid state remains ("Reset").

To "Reset," the phase-change material has to be melted and the amorphous state kept by quenching, so a high current pulse has to be applied for a short time, compared with the case of "Set." Generally, a unit phase-change memory device includes a phase-change material and a heating layer. Because the phase-change material alone cannot generate sufficient heat to cause the phase change, the heating layer is composed of a material with a high electrical resistance and contacts the phase-change material, to promote the heat generation.

Conventional phase-change memory is fabricated using CMOS technology. A unit cell consists of a single phase-change memory device and a single cell transistor. Current pulses are applied through a bit line, and a cell transistor is turned on when a voltage higher than its threshold voltage is supplied to a word line. By turning on the cell transistor, the phase-change memory device is connected to the bit line through which the current pulses are supplied. The current pulses supplied at this time perform "Set" and "Reset" of the phase-change memory device.

Since a high "Reset" current is needed, the cell transistor must be a bipolar transistor or a MOS transistor with a significantly wide gate. A vertical-structured pnp-type bipolar transistor can secure a high power density with a cell size of only $5F^2 \sim 8F^2$, but is not often used due to difficulty in processing. Accordingly, most cell transistors are MOS transistors.

In order to drive the phase-change memory device using the MOS transistor, the gate width has to be sufficient. Because such a MOS transistor occupies a large area on a silicon substrate, current research is directed toward decreasing the reset current to reduce the gate width, thereby improving integration.

Memories are classified into stand-alone memory and embedded memory. Embedded memory is differentiated from stand-alone memory by incorporating logic to perform its function within a single chip, and is one component of a System-On-Chip (SOC). By directly connecting a microprocessor to an embedded memory within an SOC, bandwidth can be increased while decreasing power consumption.

As silicon semiconductor processing techniques have developed, the functions embodied by SOCs have widened into diverse fields such as mobile communications and multimedia. The demand for chips for graphics, audio and video applications is increasing greatly. Therefore, more information must be processed in the SOC than ever before, and thus the role of embedded memory in the SOC is becoming more and more important. Increasingly high performance of embedded memory will be needed as SOCs become more complicated.

DRAM, SRAM, and FeRAM (Ferroelectric Random Access Memory) may be considered for a unit cell of the embedded memory. However, DRAM and SRAM are volatile, losing stored information when power is turned off, and FeRAM needs fastidious fabrication for a reliable device. Accordingly, an embedded memory is needed for embodying high performance and multiple functions.

SUMMARY OF THE INVENTION

The present invention provides an embedded memory required for a high performance, multifunction System On Chip (SOC).

The present invention also provides a method of fabricating the embedded memory.

According to an aspect of the present invention, there is provided an embedded phase-change memory including a bipolar transistor, a phase-change memory device and a MOS transistor, which are adjacent and electrically connected to one another, on a substrate. The bipolar transistor includes a base composed of SiGe disposed on a collector.

The phase-change memory device may include a phase-change material layer changed from an amorphous state to a crystalline state by a current. Also, a heating layer composed of SiGe contacting the lower surface of the phase-change material layer may be included.

According to another aspect of the present invention, there is provided a method of fabricating an embedded phase-change memory, including forming a collector and a collector connection layer of a bipolar transistor, and a well of a MOS transistor, in a substrate. After forming an insulating layer on the substrate between the bipolar transistor and the MOS transistor, a gate insulating layer is formed on the collector, the collector connection layer, and the well. A gate electrode is formed on the gate insulating layer over the well to form the MOS transistor. Then, the gate insulating layer on the collector and the collector connection layer is removed, and a base composed of SiGe is formed on the collector where the gate insulating layer was removed. Thereafter, an emitter electrode is formed on the base, and a collector electrode is formed on the collector connection layer to form the bipolar transistor.

At the same time as forming the base composed of SiGe, a heating layer composed of SiGe may be formed on the insulating layer. Also, the phase-change material layer may contact the heating layer to form the phase-change memory device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
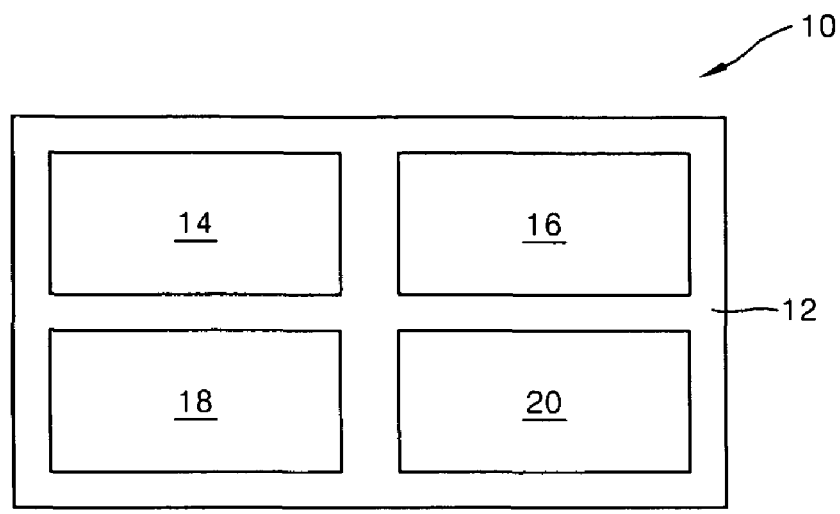
FIG. 1 is a block diagram of an SOC which uses an embedded memory according to the present invention.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. Like reference numerals denote like elements throughout the embodiments.

Embodiments of the present invention provide an embedded memory Including Hetero-junction Bipolar Transistors using SiGe (SiGe HBT). More specifically, the embedded memory according to the present invention allows for fabricating a SiGe HBT, a CMOS transistor and a phase-change memory device at one time. Therefore, the embedded memory according to the present invention will be described as having an HBT region, a CMOS transistor region and a phase-change memory region.

FIG. 1 is a block diagram of an SOC which uses an embedded memory according to the present invention.

Referring to FIG. 1, an SOC 10 includes a digital circuit 14, an analog circuit 16, a Radio Frequency (RF) circuit 18 and a memory 20, arranged on a substrate 12. Different active components may be suitable for the respective portions of the SOC 10. For example, a CMOS transistor with low power dissipation and fast switching speed is suitable for the digital circuit 14 and the memory 20, whereas a bipolar transistor with excellent frequency response is suitable for the analog circuit 16 and the RF circuit 18. The SOC 10 is best fabricated using a BiCMOS technique, by designing the digital circuit 14 and the memory 20 using CMOS transistors and the analog circuit 16 and the RF circuit 18 using bipolar transistors. However, the BiCMOS technique is expensive and complicated. Accordingly, current research is attempting to improve the high frequency characteristics of the CMOS transistor, to allow its use in the analog circuit 16 and the RF circuit 18.

While embedded memory using DRAM, SRAM, FeRAM, etc. as a unit cell is being developed, these have the difficulties of volatile characteristics and processing as described above. Therefore, these options may not keep pace with the swift development of the SOC. On the other hand, phase-change memory, with its non-volatile characteristics and relatively simple fabrication process, can be easily used in the SOC. The embodiments of the present invention suggest that an SOC that uses phase-change memory is technically superior to one using DRAM, SRAM, FeRAM, etc. as a unit cell of the embedded memory, based on the BiCMOS technique. Particularly, the SiGe BiCMOS technique is easily compatible with the conventional CMOS technique.

The SiGe BiCMOS technique is to form a SiGe HBT using an epitaxial layer added with germanium (Ge) to Si as a base, simultaneously with a CMOS transistor. Since the energy band gap of Ge is roughly 0.4 eV less than Si, a band gap difference occurs in an emitter-base junction when Ge is added to the base of the bipolar transistor, thereby increasing the current gain. Because a base dopant density can be increased while decreasing the current gain, the bipolar transistor can be made to operate in the RF frequency region by thinning the base.

In order to embody the RF circuit, SiGe or a III-V group based compound semiconductor, e.g. GaAs, whose internal mobility of charges is higher than that of Si, is used to form a bipolar transistor with an excellent frequency response. The SiGe BiCMOS technique can employ the conventional Si semiconductor process, unlike other compound semiconductors in view of the fabricating process. Furthermore, the SiGe BiCMOS technique to fabricate the embedded phase-change memory has the following advantages.

First, a bipolar cell transistor can be used to drive the phase-change memory device. Accordingly, a phase-change memory device with a high Reset current can be used in the embedded memory. As stated above, when the MOS transistor is employed as the cell transistor of the phase-change memory device, the gate width must be increased. This is because the Reset current of the phase-change memory is not satisfactorily small. For example, when the Reset current is 5 mA, an NMOS transistor with a width of about 15 µm or greater is required. In order to decrease the gate width, the Reset current must be reduced. A method of reducing the gate width is to develop a new technique of improving the characteristics of a phase-change material or adopting another memory structure. However, by using a SiGe HBT cell transistor, this difficulty can be solved. Meanwhile, the CMOS transistor may be used to form a peripheral driving circuit, e.g. a sense amplifier.

Second, the SiGe layer is used as a heating layer, greatly decreasing the reset current. The phase-change memory device hardly reaches its melting temperature by the inherent heat generation of the phase-change material caused by an input current. Therefore, a sufficient reset energy is obtained by allowing the heating layer to contact the phase-change material. That is, the heating layer is used to decrease the reset current. An effective heating layer generally has the characteristics of high electrical resistivity, low thermal conductivity and low specific heat. Since SiGe has lower thermal conductivity. and the specific heat than TiN, which is currently used as a heating layer, the reset current can be lower than in the conventional device using TiN. Also, because the electrical resistivity of the SiGe layer is in inverse proportion to its doping density, the electrical characteristics of the heating layer can be adjusted by varying the doping density.

Third, the SiGe BiCMOS technique can produce an RF circuit with better RF characteristics than the conventional CMOS technique. For example, the cutoff frequency (ft) of a SiGe HBT, that represents the RF characteristic value of the device, reaches roughly 300 GHz at present, and approaches that of GaAs HBTs that are used for wireless communication devices such as a Low Noise Amplifier (LNA), a Power Amplifier (PA) and a mixer.

Because the bipolar transistor needs many fabrication steps which are expensive and technically demanding, the BiCMOS technique is not commercially and widely available. Despite this disadvantage, the BiCMOS technique is suitable for combining circuits having various characteristics within a single chip. Thus, the BiCMOS technique allows various functions of the SOC.

First Embodiment

FIGS. 2A through 2F are sectional views illustrating a method of fabricating the embedded memory according to a first embodiment of the present invention. In this case, for convenience of description, the embedded memory is divided into an HBT region where a bipolar transistor will be formed, a phase-change memory region where a phase-change memory device will be formed, and a CMOS TR region where a CMOS transistor will be formed.

Figure 2A:
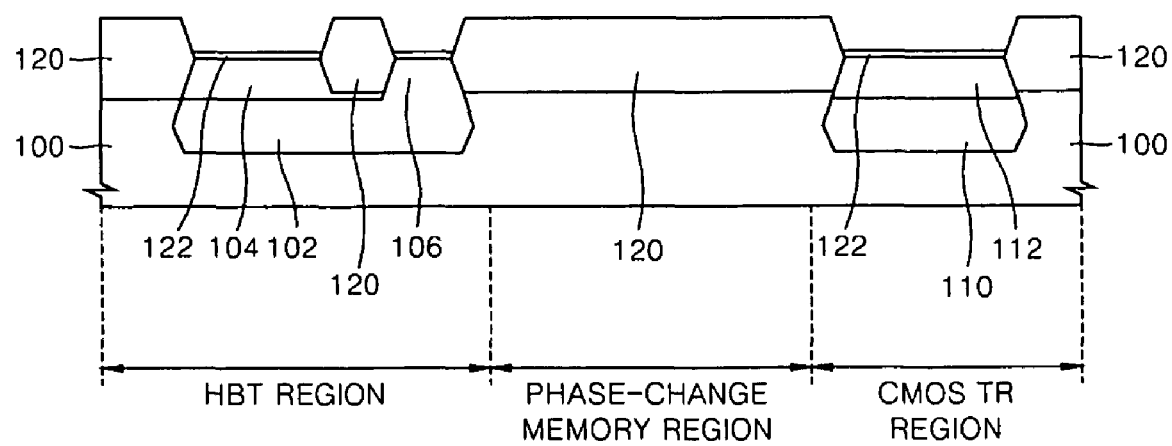
FIGS. 2A through 2F are sectional views illustrating a method of fabricating the embedded memory according to a first embodiment of the present invention.

Referring to FIG. 2A, an HBT buried layer 102, a collector 104, and a collector connection layer 106 are formed on a semiconductor substrate 100 of the bipolar transistor (HBT) region, using photolithography, ion implantation, epitaxial growth and thermal treatment. In the CMOS TR region, a CMOS TR buried layer 110 and a well 112 are formed. The phase-change memory region where the phase-change memory device will be later formed outside the HBT region and the CMOS TR region. The collector 104 and the collector connection layer 106, and the collector connection layer 106 and the well 112, are isolated from each other by an insulating layer 120 such as a thermal oxidation layer. Also, exposed surfaces of the collector 104, the collector connection layer 106 and the well 112 are covered with a gate insulating layer 122.

Figure 2B:
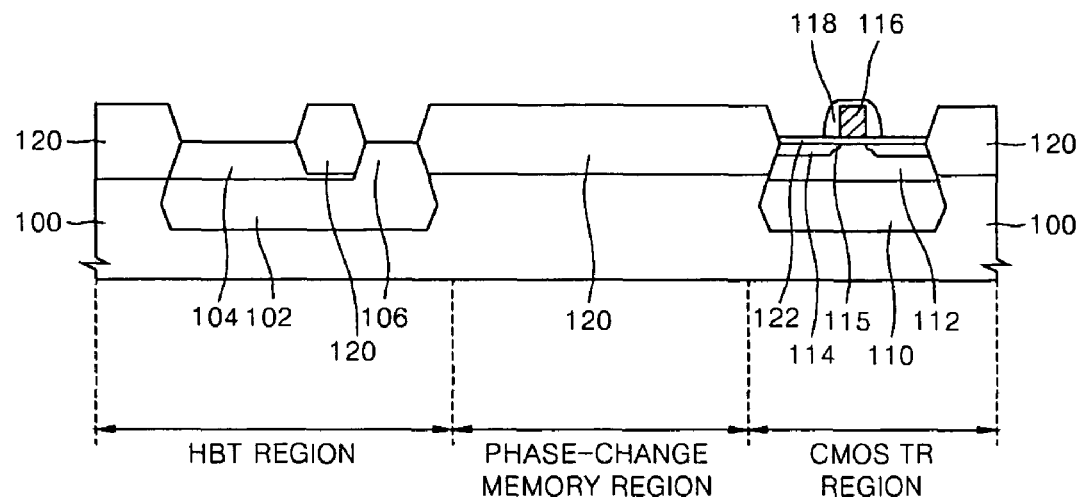

Referring to FIG. 2B, a first conductive layer (not shown), e.g. polysilicon, is deposited on the gate insulating layer 122, and is then patterned by a well known method, thereby forming a gate electrode 116 over the well 112 of the CMOS TR region. Thereafter, using the gate electrode 116 as a mask, the well 112 is ion implanted to form a Lightly Doped Drain (LDD) 115. A low temperature oxide layer deposited by CVD is dry etched to form a gate electrode sidewall 118, and source-drain regions 114 are formed by ion implantation and thermal treatment. By doing so, the CMOS transistor prior to performing metal processing is completed in the CMOS TR region. Then, the gate insulating layer 122 of the HBT region is partially removed using photolithography and dry or wet etching, thereby exposing the collector 104 and the collector connection layer 106.

Figure 2C:
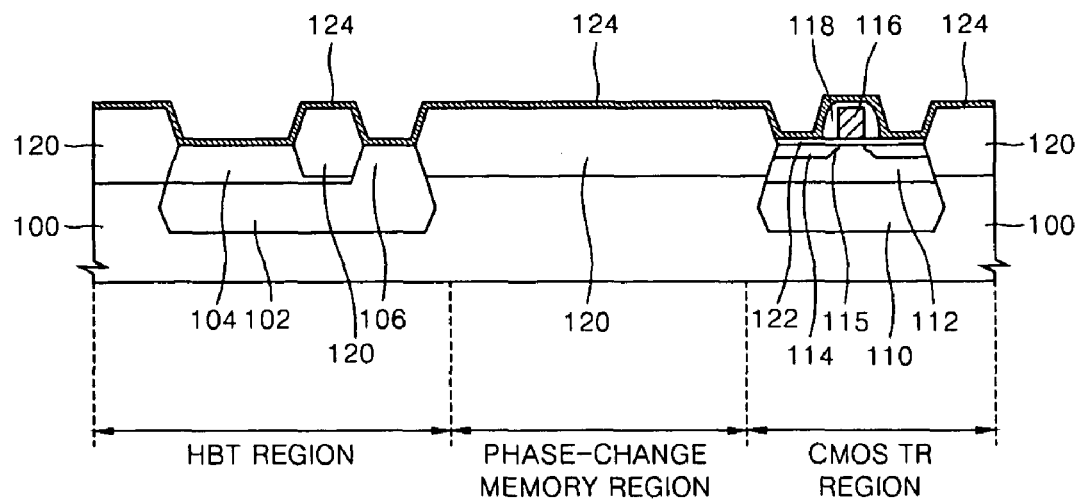

Referring to FIG. 2C, a SiGe layer 124 is deposited to a uniform thickness of 50~200 nm on the embedded memory where the gate insulating layer 122 was partially removed, using CVD or Molecular Beam Epitaxy (MBE). In this case, the Ge density within the SiGe layer 124 has an optional value greater than 0% and less than 100%, which may be adjusted in accordance with location. For example, the SiGe layer 124 becomes a P-type conductor by doping boron during the deposition, thereby acting as a base in the SiGe HBT and the heating layer 150 of FIG. 2D in the phase-change memory device. The conductivity type and density of the SiGe layer acting as the heating layer may be varied as needed by ion implantation later.

Figure 2D:
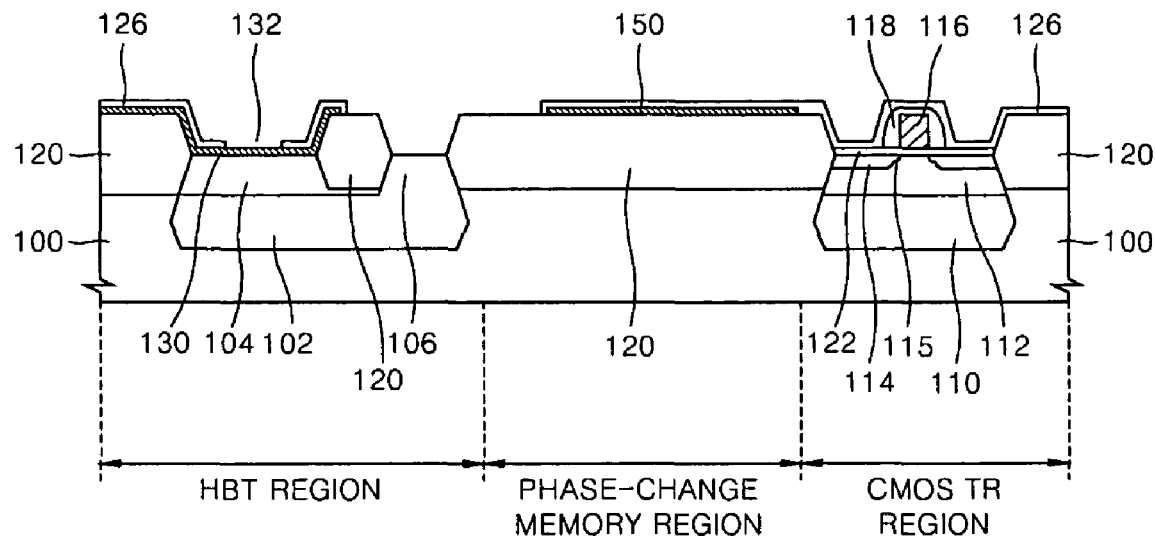

Referring to FIG. 2D, by patterning the SiGe layer 124, the base 130 is left on the HBT region and the heating layer 150 is left on the phase-change memory device region. Thereafter, a low temperature oxide layer 126 is deposited on the embedded memory having the base 130 and the heating layer 150, using CVD. In this case, the low temperature oxide layer 126 covers the base 130, the heating layer 150 and the CMOS TR region. The low temperature oxide layer 126 is partially removed by photolithography and dry etching to expose a region 132 where emitter and collector electrodes will be formed.

It is not essential to use the SiGe layer as the heating layer 150 of the phase-change memory device. That is, another SiGe layer formed after forming the SiGe HBT and the CMOS TR may be used as the heating layer 150. The heating layer 150 is not restricted to SiGe, but may be composed of at least one of W, Ti, TiW, TiN, TiAlN, Ta and a combination of these materials.

Figure 2E:
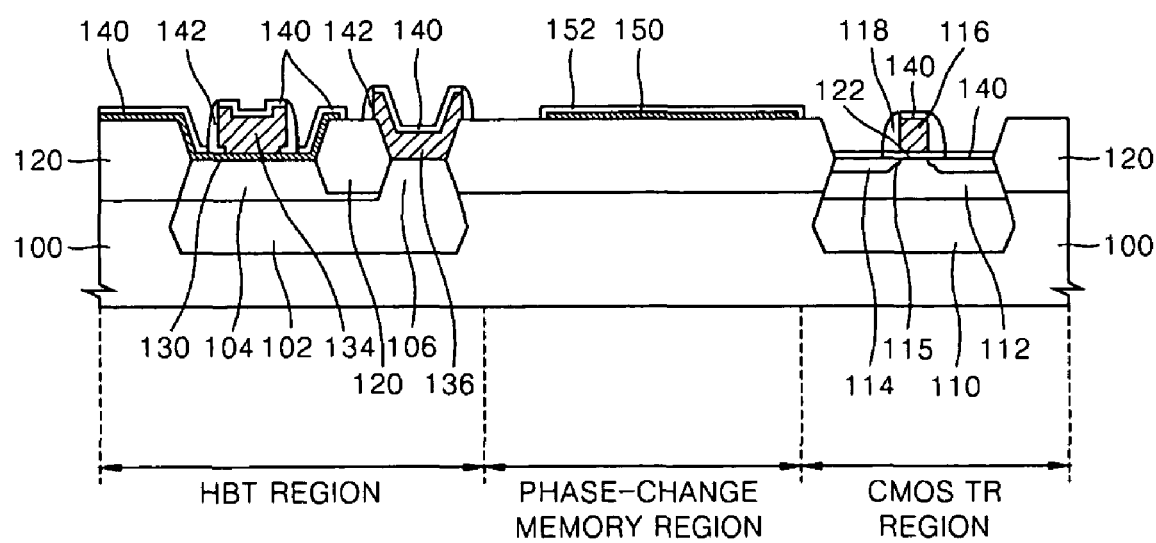

Referring to FIG. 2E, a dopant is simultaneously included when a second conductive layer (not shown), e.g. polysilicon, is deposited. Otherwise, after the deposition, ion implantation is performed to form a conductor. Then, the second conductive layer is partially removed by photolithography and dry etching to form an emitter electrode 134 and a collector electrode 136. The low temperature oxide layer 126 is removed by dry etching. Thereafter, boron or $BF_2$ may be implanted into the base 130 to form an extrinsic base (not shown).

Subsequently, a low temperature oxide layer is deposited by CVD, and sidewalls 142 of the emitter electrode 134 and the collector electrode 136, and a layer 152 that shields the SiGe heating layer 150 are formed using photolithography and dry etching. A silicide layer 140 with a low electrical resistance is formed on the upper surfaces of the exposed emitter electrode 134, the base 130 and the collector electrode 136 by self-alignment. In this case, because the SiGe heating layer 150 is covered with the protection layer 152, the silicide layer is not formed thereon. Meanwhile, when thermal treatment is performed to form the silicide layer 140, the dopant within the emitter electrode 134 diffuses into the base 130, thereby forming an emitter (not shown).

Figure 2F:
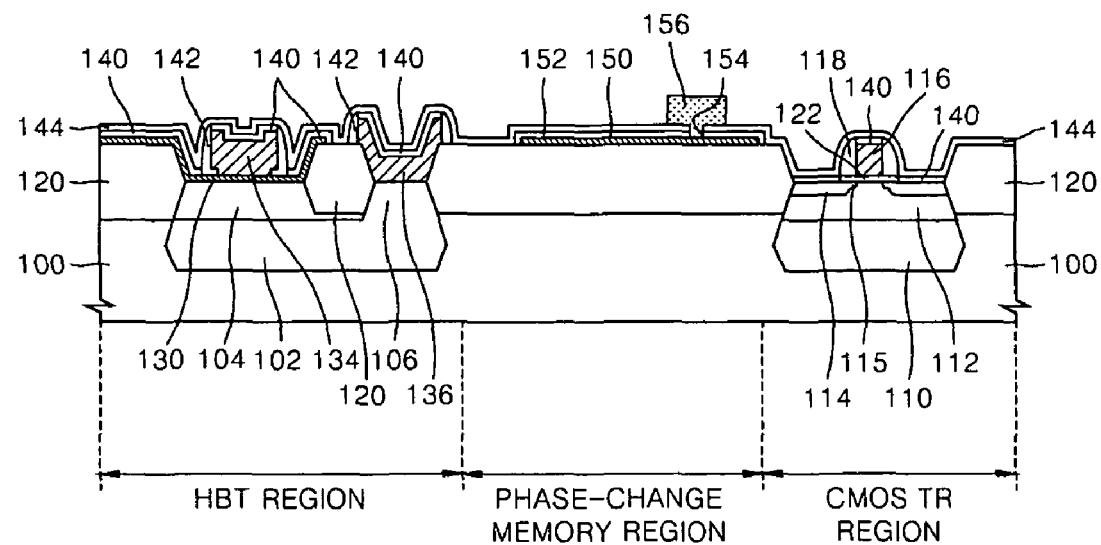

Referring to FIG. 2F, an insulating layer 144 is deposited on the entire surface of the embedded memory, and patterned to form a contact hole 154 that partially exposes the SiGe heating layer 150. Then, a phase-change material layer (not shown) is deposited by a process such as sputtering, CVD with excellent step coverage, or Atomic Layer Deposition (ALD). The phase-change material layer is patterned to form a phase-change material pattern 156. The phase-change material pattern 156 may be composed of a chalcogen compound such as $Ge_2Sb_2Te_5$(GST) and SbSe including chalcogen elements such as S, Se and Te.

Even though it is not illustrated, the SiGe HBT, the CMOS transistor and the phase-change memory device formed on the semiconductor substrate 100 can be electrically connected by back-end processing that forms a contact, a metal layer and a pad.

Second Embodiment

Figure 3:
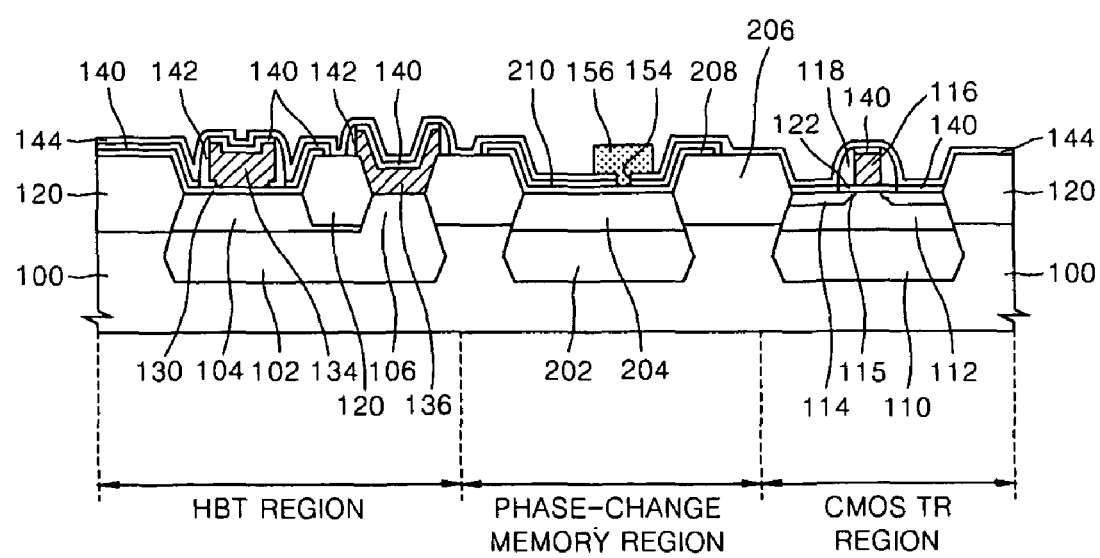
FIG. 3 is a sectional view illustrating a method of fabricating the embedded memory according to a second embodiment of the present invention.

FIG. 3 is a sectional view illustrating a method of fabricating the embedded memory according to a second embodiment of the present invention. In this case, the structure and manufacture of the HBT region and the CMOS TR region, but not the phase-change memory region, are identical to those of the first embodiment described with reference to FIGS. 2A through 2F.

Referring to FIG. 3, the phase-change memory region includes a buried layer 202 and a well 204 sequentially formed for a phase-change memory device. The well 204 has a surface exposed by an insulating layer 206, and a heating layer 208 covers the exposed surface of the well 204 and a portion of the insulating layer 206. The heating layer 208 is covered with a protection layer 210, and the protection layer 210 is partially removed to allow a phase-change material pattern 156 to contact the heating layer 208.

In the embedded memory and the method of fabricating the same according to the present invention, a bipolar transistor including a base composed of SiGe is used as a cell transistor, thereby providing the embedded memory required for a high performance, multifunction SOC. Also, a MOS transistor, a phase-change memory device and a bipolar transistor are fabricated using BiCMOS processing, thereby attaining RF characteristics equal to those used for wireless communication. Furthermore, since a heating layer of the phase-change memory device is composed of SiGe, the reset current can be decreased.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An embedded phase-change memory comprising:
    a bipolar transistor, a phase-change memory device and a MOS transistor, next to each other and directly electrically connected to one another on a substrate,
    wherein the bipolar transistor comprises a base composed of a first portion of a SiGe layer in which the base is disposed on a collector,
    wherein the phase-change memory device comprises a phase-change material layer which is changed reversibly between an amorphous state and a crystalline state by a current; and
    a heating layer contacting a lower surface of the phase-change material layer.

2. The embedded phase-change memory of claim 1, wherein the base has a thickness of 50~200 nm.

3. The embedded phase-change memory of claim 1, wherein the phase-change memory device comprises:
    the phase-change material layer which is changed reversibly between the amorphous state and the crystalline state by the current; and
    the heating layer contacting the lower surface of the phase-change material layer and the heating layer being composed of at least one material selected from the group consisting of SiGe, W, Ti, TiW, TiN, TiAlN, and Ta.

4. The embedded phase-change memory of claim 1, wherein the phase-change memory device is formed on an insulating layer on the substrate outside the bipolar transistor and the MOS transistor.

5. The embedded phase-change memory of claim 1, wherein the phase-change memory device is formed in a well in an upper portion of the substrate outside the bipolar transistor and the MOS transistor.

6. The embedded phase-change memory of claim 1, wherein the phase-change material layer is composed of $Ge_2Sb_2Te_5$.

7. The embedded phase-change memory of claim 1, wherein the phase-change memory device is immediately between the bipolar transistor and the MOS transistor.

* * * * *